United States Patent [19]

Morita

[11] Patent Number: 5,091,758
[45] Date of Patent: Feb. 25, 1992

[54] SEMICONDUCTOR LIGHT-EMITTING DEVICES

[75] Inventor: Yoshio Morita, Osaka, Japan

[73] Assignee: Matsushita Electric Industrial Co., Ltd., Japan

[21] Appl. No.: 544,579

[22] Filed: Jun. 27, 1990

[30] Foreign Application Priority Data

Jun. 27, 1989 [JP] Japan .................. 1-164680

[51] Int. Cl.$^5$ .................. H01L 33/00; H01L 29/161; H01L 29/20
[52] U.S. Cl. .................. 357/17; 357/61; 357/16
[58] Field of Search .................. 357/16, 17, 61

[56] References Cited

U.S. PATENT DOCUMENTS

| | | | |
|---|---|---|---|
| 4,077,817 | 3/1978 | Bellavance | 357/16 |
| 4,335,266 | 6/1982 | Mickelsen et al. | 357/16 |
| 4,376,659 | 3/1983 | Castro | 357/16 |
| 4,523,051 | 6/1985 | Mickelsen et al. | 357/16 |
| 4,684,761 | 8/1987 | Devaney | 357/16 |
| 4,819,058 | 4/1989 | Nishizawa | 357/17 |
| 4,843,031 | 6/1989 | Bau et al. | 357/17 |
| 4,916,496 | 4/1990 | Tomomura et al. | 357/17 |

OTHER PUBLICATIONS

"$Zn_yCd_{1-y}S$—$CuAl_xGa_{1-x}S_2$ Heterodiode" by Nozomu Tsunoi et al; PCM88-53 (1988); pp. 13-20.
"Preparation and Properties of Green-Light-Emitting DcS-CuGaS$_2$ Heterodiodes" by Sigurd Wagner; Journal of Applied Physics, vol. 45, No. 1, Jan. 1974; pp. 246-251.

*Primary Examiner*—Andrew J. James
*Assistant Examiner*—Donald L. Monin, Jr.
*Attorney, Agent, or Firm*—Lowe, Price, LeBlanc & Becker

[57] ABSTRACT

Light-emitting semiconductor devices comprising a substrate and a p-n junction structure formed on the substrate are described. The p-n junction structure is made of a combination of a wide gap semiconductor layer made of a p-type chalcopyrite semiconductor of the formula, $(Cu_aAg_{1-a})(Al_bGa_{1-b})(Se$ or $S)_2$ wherein $0 \leq a \leq 1$ and $0 \leq b \leq 1$, and an n-type II–VI semiconductor of the formula, $(Zn_cCd_{1-c})(S_dSe_{1-d}$ or $Se_dTe_{1-d})$ wherein $0 \leq c \leq 1$ and $0 \leq d \leq 1$. By this, light-emitting diodes are obtained. When an active layer is provided between the n and p-type layers, semiconductor laser devices are obtained. These devices are capable of emitting blue light to UV light.

30 Claims, 1 Drawing Sheet

SEMICONDUCTOR LIGHT-EMITTING DEVICES

BACKGROUND OF THE INVENTION

1. Field of the Invention

This invention relates to semiconductor light-emitting or luminescent devices such as light emitting diodes, semiconductor laser devices and the like, which devices are capable of emitting light or oscillation over a wide wavelength range of from blue light to ultraviolet region.

2. Description of the Prior Art

As is well known in the art, light emitting diodes are potential light emitting parts, and red light emitting devices using AlGaAs and green light emitting devices using GaP have been now widely employed as display devices. At present, there is a great demand for blue light emitting devices, which can stand practical use, for multiple coloration purposes. However, such blue light emitting devices have not been in use yet.

On the other hand, in the fields of semiconductor laser devices, semiconductor laser devices using III-V semiconductors (compounds of Groups III-V of the periodic table) such as AlGaAs/GaAs have been actually employed in optical disks for signal pickup purposes. If the oscillation wavelength of the semiconductor laser device for signal pickup can be shortened, the quantity of information memorizable in the disk can be increased, enabling one to enhance the information processability of the optical disk. In the fields of laser printers, the shortening of the oscillation wavelength can improve the sensitivity of photosensitive material and increase the printing speed. Thus, in order to improve the performance of information processing apparatus and other hose-use instruments, it is necessary to shorten the oscillation wavelength of semiconductor laser devices. To this end, the active layer of the semiconductor laser device should make use of a direct transient III-V semiconductive compound having a great band gap. Among direct transient III-V semiconductive compounds, those materials having a great forbidden band gap include AlGaInP. When this material is used as the active layer, the oscillation wavelength ranges from 580 to 690 nm. As a material having a greater band gap among the direct transient semiconductive compounds, there is known Zn(SSe) which is a II-VI semiconductor. The use of the above semiconductor to constitute a double heterostructure provides the possibility of realizing a semiconductor laser device capable of emitting light with a short wavelength. At present, because of the difficulty in controlling the p-type conduction, any semiconductor laser device using Zn(SSe) semiconductors have not been in use yet.

On the other hand, the possibility of fabricating p-n junction light-emitting devices using combinations of n-type II-VI semiconductors (i.e. semiconductive compounds of Group II-VI of the periodic table) and p-type chalcopyrite compounds is known, for example, in J. Appl. Phys., 45 (1974) 246, by Sigurd Wagner and Technical Report of the Society of the Electron Information Communication, CPM88-5, 3(1988), by Nozomu Tsuboi et al. According to these papers, heterojunction diodes are fabricated using combinations of II-VI semiconductors and chalcopyrite compounds, both having a great forbidden band gap. In the former paper, it is stated that green light emission is attained at 77° K. by the use of the combination of CdS—CuGaS$_2$. In the latter paper, it is stated that yellowish orange light is emitted at room temperature by the use of the combination of ZnCdS—CuAlGaS$_2$.

SUMMARY OF THE INVENTION

It is accordingly an object of the present invention to provide novel combinations of light emitting materials which are capable of emitting light with a wavelength ranging from blue light to ultraviolet light.

It is another object of the invention to provide light-emitting diodes and semiconductor laser devices which make use of combinations of n-type II-VI semiconductors and p-type chalcopyrite compounds.

According to one embodiment of the invention, there is provided a semiconductor light-emitting device which comprises a substrate and an p-n junction structure formed on the substrate. The p-n junction structure has a p-type semiconductor layer consisting essentially of $(Cu_aAg_{1-a})(Al_bGa_{1-b})Se_2$, wherein $0 \leq a \leq 1$ and $0 \leq b \leq 1$ and an n-type semiconductor layer consisting essentially of $(Zn_cCd_{1-c})(S_dSe_{1-d})$, wherein $0 \leq c \leq 1$ and $0 \leq d \leq 1$.

When an active layer of $(Cu_aAg_{1-a})(Al_bGa_{1-b})Se_2$ or $(Zn_cCd_{1-c})(S_dSe_{1-d})$, wherein a, b, c and d have, respectively, the same meanings as defined above, is sandwiched between the p-type and n-type semiconductor layers, a light-emitting device having a double heterostructure can be fabricated.

According to another embodiment of the invention, there is also provided a semiconductor light-emitting device which comprises a substrate and an p-n junction structure formed on the substrate. The p-n junction structure has a p-type semiconductor layer consisting essentially of $(Cu_{a'}Ag_{1-a'})(Al_{b'}Ga_{1-b'})S_2$, wherein $0 \leq a' \leq 1$ and $0 \leq b' \leq 1$ and an n-type semiconductor layer consisting essentially of $(Zn_{c'}Cd_{1-c'})(S_{d'}Se_{1-d'})$, wherein $0 \leq c' \leq 1$ and $0 \leq d' \leq 1$. Similar to the first embodiment, when an active layer of $(Cu_{a'}Ag_{1-a'})(Al_{b'}Ga_{1-b'})S_2$ or $(Zn_{c'}Cd_{1-c'})(S_{d'}Se_{1-d'})$, wherein a', b', c' and d' have, respectively, the same meanings as defined above, is sandwiched between the p-type and n-type semiconductor layers, a light-emitting device having a double heterostructure can be fabricated.

According to a further embodiment of the invention, there is provided a light-emitting semiconductor device which comprises a substrate and an p-n junction structure formed on the substrate. The p-n junction structure has a p-type semiconductor layer consisting essentially of $(Cu_{a''}Ag_{1-a''})(Al_{b''}Ga_{1-b''})Se_2$, wherein $0 \leq a'' \leq 1$ and $0 \leq b'' \leq 1$ and an n-type semiconductor layer consisting essentially of $(Zn_{c''}Cd_{1-c''})(Se_{d''}Te_{1-d''})$, wherein $0 \leq c'' \leq 1$ and $0 \leq d'' \leq 1$. Similar to the first and second embodiments, when an active layer of $(Cu_{a''}Ag_{1-a''})(Al_{b''}Ga_{1-b''})Se_2$ or $(Zn_{c''}Cd_{1-c''})(Se_{d''}Te_{1-d''})$, wherein a'', b'', c'' and d'' have, respectively, the same meanings as defined above, is sandwiched between the p-type and n-type semiconductor layers, a light-emitting device having a double heterostructure can be fabricated.

As will be apparent from the above, the light-emitting devices according to the invention make use of p-type semiconductors of (Cu and/or Ag)(Al and/or Ga)(Se or S) and n-type semiconductors of (Zn and/or Cd)(S and/or Se or Se and/or Te). Moreover, heterostructures for the respective devices are formed by using as an active layer a corresponding chalcopyrite semiconductor or II-VI semiconductor. It will be noted that the term "II-VI semiconductor" is intended to mean a semiconductive compound of elements of Groups II–VI of the periodic table.

DETAILED DESCRIPTION AND EMBODIMENTS OF THE INVENTION

Figure 1:
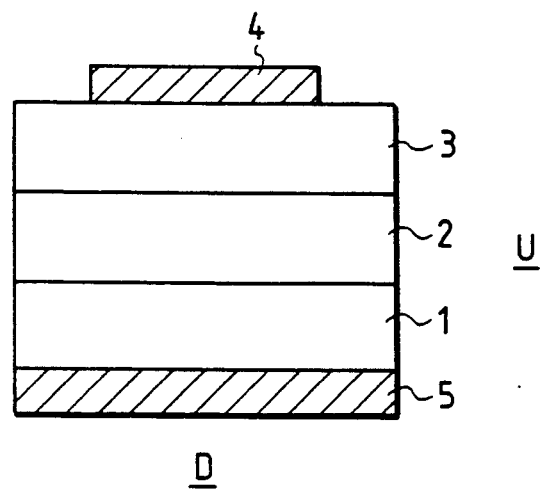
FIG. 1 is a schematic side view of a light-emitting diode according to the invention.

Reference is now made to the accompanying drawings wherein like reference numerals indicate like parts or members unless otherwise indicated.

In FIG. 1, there is generally shown a light-emitting diode D including a substrate 1, and an n-type or p-type semiconductor layer 2 which depends on the semiconduction type of substrate 1 and, correspondingly, a p-type or n-type semiconductor layer 3 formed on the substrate 1. If the substrate 1 is made of an n-type semiconductor, the layer 2 should be made of an n-type semiconductor and the layer 3 should be made of a p-type semiconductor. On the contrary, when the substrate 1 is made of a p-type semiconductor, the layers 2 and 3 are, respectively, made of p-type and n-type semiconductors.

In the figure, reference numerals 4 and 5 are, respectively, electrodes.

The substrate 1 of the diode D may be made of either n-type semiconductors or p-type semiconductors. Examples of the n-type semiconductors include n-type GaAs, GaP, InP and the like. Examples of the p-type semiconductors include p-type GaAs, GaP, InP and the like.

As described above, if an n-type semiconductor substrate is used, an n-type II–VI semiconductor layer 2 is formed on the substrate 1, on which a p-type chalcopyrite semiconductor layer 3 is formed to give a p-n junction. The present invention is characterized by the p-n junction structure made of novel combinations of n-type and p-type semiconductors.

According to one embodiment of the invention, there is used a combination of a p-type semiconductor represented by the formula, $(Cu_aAg_{1-a})(Al_bGa_{1-b})Se_2$, wherein $0 \leq a \leq 1$ and $0 \leq b \leq 1$ and an n-type semiconductor represented by the formula, $(Zn_cCd_{1-c})(S_dSe_{1-d})$, wherein $0 \leq c \leq 1$ and $0 \leq d \leq 1$. The p-type semiconductor defined above is a chalcopyrite compound which is a wide band gap semiconductor and is doped with an element, such as P, by a usual manner to make a p-type semiconductor. The n-type semiconductor is made of elements of Groups II–VI of the periodic table and is doped with Ga or the like element. When the compositions of the p-type and n-type semiconductors are varied, the band gap can be arbitrarily changed, making it possible to select an oscillation wavelength from a wide range. This combination is able to emit light with a wavelength ranging from 440 to 670 nm.

When using the above combination, blue light is emitted by application of an appropriate potential.

The light-emitting diode having such a p-n junction structure as described above can be fabricated, for example, by a molecular beam epitaxy (MBE) technique. Only for convenience' sake, fabrication of a light-emitting diode using an n-type substrate such as GaAs is described.

An n-type GaAs substrate 1 is heated to a temperature of from 200° to 500° C. A source material of the elements of Group II–IV such as Zn, Cd, Se and/or S in predetermined ratios is grown on the substrate by the MBE technique in a thickness of from 0.5 to 2 μm, during which an impurity such as Ga is doped to make an n-type semiconductor. Subsequently, a source material of the elements for the chalcopyrite such as Cu, Ag, Al, Se and/or Ga in predetermined ratios is heated to a temperature of from 300° to 600° C. and grown on the n-type semiconductor layer in a thickness of from 0.5 to 2 μm. During the growth, an impurity such as P is doped to make the p-type semiconductor.

For the growth of the n-type and p-type semiconductor layers on the substrate, the lattice match between the substrate and the semiconductors should be taken into account in order to avoid defects which would be formed owing to the lattice mismatch. To this end, the respective semiconductor compositions should be chosen to permit lattice matching with the substrate material.

The electrodes 4, 5 as shown in FIG. 1 are formed by any known technique such as vacuum deposition and the like. Au-Ge, Au-Sn, Au-Si and the like may be used as an n-type electrode and In-Ga may be used as a p-type electrode.

In order for lattice matching with the combination of the n-type semiconductor and the p-type chalcopyrite semiconductor used in this embodiment, the substrate should preferably be made of GaAs or InP although not critical.

Figure 2:
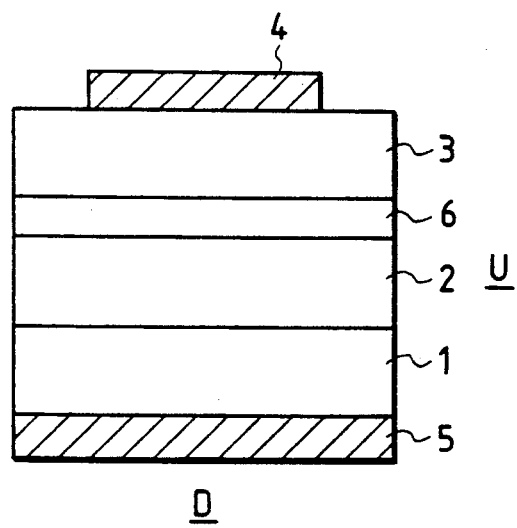
FIG. 2 is a schematic side view of a light-emitting semiconductor device having a heterostructure according to the invention.

FIG. 2 shows a semiconductor laser device having a double heterostructure wherein an active layer 6 is provided between the n-type and p-type semiconductor layers 2, 3 of FIG. 1. When the combination of the n-type and p-type semiconductors defined in the above embodiment is used, the active layer should be made of $(Cu_aAg_{1-a})(Al_bGa_{1-b})Se_2$ or $(Zn_cCd_{1-c})(S_dSe_{1-d})$, wherein a, b, c and d have, respectively, the same meanings as defined above. By this, the heterostructure is formed as shown in FIG. 2.

This active layer 6 can be formed by the MBE technique as described before, preferably in a thickness of from 0.1 to 0.2 μm. By the formation of the active layer, a semiconductor laser device having an oscillation wavelength of from 480 to 680 nm can be obtained.

According to the second embodiment, there is provided another combination, used as the p-n junction structure as shown in FIG. 1, of an n-type II–VI semiconductor and a p-type chalcopyrite semiconductor. More particularly, the p-n junction structure has a p-type semiconductor layer consisting essentially of $(Cu_{a'}Ag_{1-a'})(Al_{b'}Ga_{1-b'})S_2$, wherein $0 \leq a' \leq 1$ and $0 \leq b' \leq 1$ and an n-type semiconductor layer consisting essentially of $(Zn_{c'}Cd_{1-c'})(S_{d'}Se_{1-d'})$, wherein $0 \leq c' \leq 1$ and $0 \leq d' \leq 1$. Similar to the first embodiment, when an active layer of $(Cu_{a'}Ag_{1-a'})(Al_{b'}Ga_{1-b'})S_2$ or $(Zn_{c'}Cd_{1-c'})(S_{d'}Se_{1-d'})$, wherein a', b', c' and d' have, respectively, the same meanings as defined above, is sandwiched between the p-type and n-type semiconductor layers, a semiconductor laser device having a double heterostructure can be fabricated. The use of the combination according to this embodiment is effective in emitting light with a wavelength ranging from 350 to 460 nm and a laser beam with a wavelength ranging from 360 to 470 nm.

The light-emitting diode and semiconductor laser device using the n and p-type semiconductors can be fabricated similar to those described with respect to the first embodiment except that for lattice matching, a substrate made of GaP is preferably used.

According to a further embodiment, there is employed a combination, used as the p-n junction structure, of a p-type semiconductor layer consisting essentially of $(Cu_{a''}Ag_{1-a''})$ $(Al_{b''}Ga_{1-b''})Se_2$, wherein $0 \leq a'' \leq 1$ and $0 \leq b'' \leq 1$ and an n-type semiconductor layer consisting essentially of $(Zn_{c''}Cd_{1-c''})$ $(Se_{d''}Te_{1-d''})$, wherein $0 \leq c'' \leq 1$ and $0 \leq d'' \leq 1$. Similar to the first and second embodiments, when an active layer of $(Cu_{a''}Ag_{1-a''})$ $(Al_{b''}Ga_{1-b''})Se_2$ or $(Zn_{c''}Cd_{1-c''})$ $(Se_{d''}Te_{1-d''})$, wherein a'', b'', c'' and d'' have, respectively, the same meanings as defined above, is sandwiched between the p-type and n-type semiconductor layers, a light-emitting diode having a double heterostructure can be fabricated.

The use of the combination according to this embodiment is effective in emitting light with a wavelength ranging from 460 to 670 nm and a laser beam with a wavelength ranging from 470 to 680 nm.

The light-emitting diode and semiconductor laser device using the n and p-type semiconductors of the third embodiment can be fabricated similar to those described with respect to the first embodiment except that for lattice matching, a substrate made of InP is preferably used.

The present invention is described in more detail by way of examples, which should not be construed as limitation thereof.

EXAMPLE 1

An n-type GaAs substrate was provided and had a lattice constant of a=5.653 angstroms. The substrate was heated to 300° C., on one side of which a 1 μm thick n-type $Zn(S_{0.06}Se_{0.94})$ layer was grown by subjecting a source of Zn, Se and S at a (Se+S)/Zn flux ratio of 2 to the molecular beam epitaxy method during which Ga was doped at $10^{18}/cm^3$ to make an n-type layer. Subsequently, a source of Cu, Ag, Al and Se was heated at a substrate temperature of 400° C. at a Se/Al flux ratio of 2 and a Cu/Al flux ratio of 1 to grow a 1 μm thick p-type $(Cu_{0.89}Ag_{0.11})AlSe_2$ layer. During the growth, P was doped at $10^{18}/cm^3$ to make a p-type layer. The band gap of the n-type and p-type layers was 2.76 eV. An In-Ga electrode was formed on the top of the p-type semiconductor layer and an Au-Ge electrode was formed on the other side of the substrate to obtain a light-emitting diode as shown in FIG. 1.

A current was passed through the diode to evaluate a current-voltage characteristic. As a result, blue light with a light emission wavelength of 450 nm was emitted at a forward current of 20 mA with an luminous intensity of 100 mcd. At the operating current, the life of the diode was not shorter than 10,000 hours.

EXAMPLE 2

The general procedure of Example 1 was repeated except that a 0.12 μm thick active layer of $(Cu_{0.89}Ag_{0.11})$ $(Al_{0.80}Ga_{0.20})Se_2$ was provided between the n-type layer and the p-type layer under lattice matching conditions. The active layer had a band gap of 2.56 eV.

Thus, a semiconductor laser device as shown in FIG. 2 was obtained. A current was passed through the device to evaluate a current-light output power characteristic. As a result, it was found that at a forward current of 80 mA, a blue laser beam was emitted at an oscillation wavelength of 484 nm with a light output power of 5 mW. At the operating current, the life was as long as 10,000 hours or over.

EXAMPLE 3

In this example, an n-type InP substrate was provided, on one side of which a 1 μm thick n-type $Cd(S_{0.83}Se_{0.17})$ semiconductor layer, a 0.12 μm thick $(Zn_{0.49}Cd_{0.51})Se$ active layer and a 1 μm thick p-type $(Cu_{0.32}Ag_{0.68})$ $(Al_{0.52}Ga_{0.48})Se_2$ semiconductor layer whose lattice constants coincided with the lattice constant of the InP of 5.869 angstroms were formed by the MBE method. An In-Ga electrode was formed on the p-type layer and an Au-Sn electrode was formed on the other side of the substrate by a vacuum deposition method. The band gap of the n-type and p-type layers was 2.32 eV and the band gap of the active layer was 2.17 eV. The n-type layer and the active layer were grown at a growth temperature of 300° C. and the p-type layer was formed at a growth temperature of 400° C. Thus, a semiconductor laser device as shown in FIG. 2 was obtained.

A current was passed through the laser device to evaluate a current-light output power characteristic, revealing that at a forward current of 80 mA, a laser beam with an oscillation wavelength of 570 nm was emitted at an output power of 5 mW. The device had a long life of 10,000 hours or over at the operating current.

EXAMPLE 4

In this example, an n-type GaP substrate was provided, on one side of which a 1 μm thick n-type $Zn(S_{0.85}Se_{0.15})$ semiconductor layer and a 1 μm thick p-type $(Cu_{0.74}Ag_{0.26})$ $(Al_{0.98}Ga_{0.02})S_2$ semiconductor layer whose lattice constants coincided with the lattice constant of the GaP of 5.449 angstroms were formed by the MBE method. An In-Ga electrode was formed on the p-type layer and an n-type Au-Si electrode was formed on the other side of the substrate by a vacuum deposition method. The band gap of the n-type and p-type layers was 3.55 eV. The n-type layer was grown at a growth temperature of 300° C. and the p-type layer was formed at a growth temperature of 400° C. Thus, a light-emitting diode laser as shown in FIG. 1 was obtained.

A current was passed through the diode to evaluate a current-voltage characteristic. As a result, UV light with a light emission wavelength of 350 nm was emitted at a forward current of 20 mA with an luminous intensity of 100 mcd. At the operating current, the life of the diode was 10,000 hours or over.

EXAMPLE 5

The general procedure of Example 4 was repeated except that a 0.12 μm thick active layer of $(Cu_{0.75}Ag_{0.25})$ $(Al_{0.78}Ga_{0.22})S_2$ was provided between the n-type layer and the p-type layer under lattice matching conditions. The active layer had a band gap of 3.35 eV.

The active layer and the p-type layer were, respectively, grown at a growth temperature of 400° C.

Thus, a semiconductor laser device as shown in FIG. 2 was obtained. A current was passed through the device to evaluate a current-light output power characteristic. As a result, it was found that at a forward current of 80 mA, a UV laser beam with an oscillation wavelength of 370 nm was emitted at a light output power of 5 mW. At the operating current, the life was as long as 10,000 hours or over.

EXAMPLE 6

In this example, an n-type GaAs substrate was provided, on one side of which a 1 μm thick n-type ($Zn_{0.40}Cd_{0.60}$)S semiconductor layer, a 0.12 μm thick $Zn(S_{0.06}Se_{0.94})$ active layer and a 1 μm thick p-type ($Cu_{0.27}Ag_{0.73}$) ($Al_{0.30}Ga_{0.70}$)$S_2$ semiconductor layer whose lattice constants coincided with the lattice constant of GaAs of 5.653 angstroms were formed by the MBE method. An In-Ga electrode was formed on the p-type layer and an Au-Ge electrode was formed on the other side of the substrate by a vacuum deposition method. The band gap of the n-type and p-type layers was 2.76 eV and the band gap of the active layer was 2.76 eV. The n-type layer and the active layer were grown at a growth temperature of 300° C. and the p-type layer was formed at a growth temperature of 400° C. Thus, a semiconductor laser device as shown in FIG. 2 was obtained.

A current was passed through the laser device to evaluate a current-light output power characteristic, revealing that at a forward current of 80 mA, a blue laser beam with an oscillation wavelength of 450 nm was emitted at an output power of 5 mW. The device had a long life of 10,000 hours or over at the operating current.

EXAMPLE 7

In this example, an n-type InP substrate was provided on one side of which a 1 μm thick n-type $Zn(S_{0.52}Te_{0.48})$ semiconductor layer and a 1 μm thick p-type ($Cu_{0.32}Ag_{0.68}$) ($Al_{0.72}Ga_{0.28}$)$Se_2$ semiconductor layer whose lattice constants coincided with the lattice constant of the InP of 5.869 angstroms were formed by the MBE method. An In-Ga electrode was formed on the p-type layer and an n-type Au-Sn electrode was formed on the other side of the substrate by a vacuum deposition method. The band gap of the n-type and p-type layers was 2.50 eV. The n-type layer was grown at a growth temperature of 300° C. and the p-type layer was formed at a growth temperature of 400° C. Thus, a light-emitting diode laser as shown in FIG. 1 was obtained.

A current was passed through the diode to evaluate a current-voltage characteristic. As a result, light with a light emission wavelength of 496 nm was emitted at a forward current of 20 mA with an luminous intensity of 100 mcd. At the operating current, the life of the diode was 10,000 hours or over.

EXAMPLE 8

The general procedure of Example 7 was repeated except that a 0.12 μm thick active layer of ($Cu_{0.32}Ag_{0.68}$) ($Al_{0.52}Ga_{0.48}$)$Se_2$ was provided between the n-type layer and the p-type layer under lattice matching conditions. The active layer had a band gap of 2.30 eV.

In the procedure, the active layer and the p-type layer were, respectively, grown at a growth temperature of 400° C.

Thus, a semiconductor laser device as shown in FIG. 2 was obtained. A current was passed through the device to evaluate a current-light output power characteristic. As a result, it was found that at a forward current of 80 mA, a laser beam with an oscillation wavelength of 540 nm was emitted at a light output power of 5 mW. At the operating current, the life was as long as 10,000 hours or over.

EXAMPLE 9

The general procedure of Example 7 was repeated except that a 0.12 μm thick active layer of ($Zn_{0.71}Cd_{0.29}$) ($Se_{0.82}Te_{0.18}$) was provided between the n-type layer and the p-type layer under lattice matching conditions. The active layer had a band gap of 2.30 eV.

In the procedure, the n-type layer and the active layer were, respectively, grown at a growth temperature of 300° C. and the p-type layer was grown at 400° C.

Thus, a semiconductor laser device as shown in FIG. 2 was obtained. A current was passed through the device to evaluate a current-light output power characteristic. As a result, it was found that at a forward current of 80 mA, a laser beam with an oscillation wavelength of 540 nm was emitted at a light output power of 5 mW. At the operating current, the life was as long as 10,000 hours or over.

In the above examples, the semiconductor substrates used were those made of GaAs, GaP and InP, but not limited to those semiconductors. In Examples 1 to 3, any semiconductor which has a lattice constant smaller than that of $AgGaSe_2$ and larger than GaAs may be used. Likewise, in Examples 4 to 6, any semiconductor having a lattice constant smaller than that of $AgGaS_2$ and larger than that of $Zn(S_{0.90}Se_{0.10})$ may be used. In Examples 7 to 9, any semiconductor having a lattice constant smaller than that of $AgGaSe_2$ and larger than that of ZnSe may be used.

Moreover, the substrates used in the examples are of the n-type, so that the device is arranged to form on the substrate an n-type layer, an active layer and a p-type layer in this order. However, if a p-type substrate is used, a p-type layer, an active layer and an n-type layer are formed on the p-type substrate in this order.

The devices of the invention may be further provided with a buffer layer or a stripe structure for current stricture including an electrode stripe or an internal stripe, if necessary.

As will be apparent from the foregoing, according to the invention, there can be obtained light-emitting semiconductor devices capable of emitting blue to UV light or beams which have not been obtained by known hetero junction devices of $CdS-CuGaS_2$ or $ZnCdS-CuAlGaS_2$ hetero junction devices. This is considered to result from epitaxial growth of a II–VI semiconductor and a specific type of chalcopyrite semiconductor on a semiconductor substrate to form thin films of good quality. By this, an output of a light wavelength corresponding to an energy close to the band gap can be achieved. These devices are suitable for multi-coloration of light-emitting diodes and improving the performance of information processing apparatus such as optical disks, laser printers and the like.

What is claimed is:

1. A light-emitting semiconductor device which emits light with a wavelength of from 440 to 670 nm comprising a substrate and a p-n junction structure formed on the substrate, the p-n junction structure having a p-type semiconductor layer consisting essentially of $(Cu_aAg_{1-a})$ $(Al_bGa_{1-b})Se_2$, wherein $0 \leq a \leq 1$ and $0 \leq b \leq 1$ and an n-type semiconductor layer consisting essentially of $(Zn_cCd_{1-c})$ $(S_dSe_{1-d})$, wherein $0 \leq c \leq 1$ and $0 \leq d \leq 1$.

2. A light-emitting semiconductor device according to claim 1, wherein said substrate is in lattice matching with the p-n junction structure.

3. A light-emitting semiconductor device according to claim 1, wherein said substrate is of an n-type and the n-type semiconductor layer and the p-type semiconductor layer are formed on the said substrate in this order.

4. A light-emitting semiconductor device according to claim 1, wherein said substrate is of a p-type and the p-type semiconductor layer and the n-type semiconductor layer are formed on the said substrate in this order.

5. A light-emitting semiconductor device according to claim 1, further comprising an active layer of $(Cu_aAg_{1-a})$ $(Al_bGa_{1-b})Se_2$ or $(Zn_cCd_{1-c})$ $(S_dSe_{1-d})$, wherein a, b, c and d have, respectively, the same meanings as defined above, which is sandwiched between the p-type and n-type semiconductor layers whereby a semiconductor laser device having a heterostructure is obtained.

6. A light-emitting semiconductor device which emits light with a wavelength of from 350 to 460 nm or a laser beam with a wavelength of from 360 to 470 nm comprising substrate and a p-n junction structure formed on the substrate, the p-n junction structure having a p-type semiconductor layer consisting essentially of $(Cu_{a'}Ag_{1-a'})$ $(Al_{b'}Ga_{1-b'})S_2$, wherein $0 \leq a' \leq 1$ and $0 \leq b' \leq 1$ and an n-type semiconductor layer consisting essentially of $(Zn_{c'}Cd_{1-c'})$ $(S_{d'}Se_{1-d'})$, wherein $0 \leq c' \leq 1$ and $0 \leq d' \leq 1$.

7. A light-emitting semiconductor device according to claim 6, wherein said substrate is in lattice matching with the p-n junction structure.

8. A light-emitting semiconductor device according to claim 6, wherein said substrate is of an n-type and the n-type semiconductor layer and the p-type semiconductor layer are formed on the said substrate in this order.

9. A light-emitting semiconductor device according to claim 6, wherein said substrate is of a p-type and the p-type semiconductor layer and the n-type semiconductor layer are formed on the said substrate in this order.

10. A light-emitting semiconductor device according to claim 6, further comprising an active layer of $(Cu_{a'}Ag_{1-a'})$ $(Al_{b'}Ga_{1-b'})S_2$ or $(Zn_{c'}Cd_{1-c'})$ $(S_{d'}Se_{1-d'})$, wherein a', b', c' and d' have, respectively, the same meanings as defined above, which is sandwiched between the p-type and n-type semiconductor layers, whereby a semiconductor laser device having a double heterostructure is obtained.

11. A light-emitting semiconductor device which emits light with a wavelength of from 460 to 670 nm or a laser beam with a wavelength of from 460 to 670 nm comprising a substrate and a p-n junction structure formed on the substrate, the p-n junction structure having a p-type semiconductor layer consisting essentially of $(Cu_{a''}Ag_{1-a''})$ $(Al_{b''}Ga_{1-b''})Se_2$, wherein $0 \leq a'' \leq 1$ and $0 \leq b'' \leq 1$ and an n-type semiconductor layer consisting essentially of $(Zn_{c''}Cd_{1-c''})$ $(S_{d''}Se_{1-d''})$, wherein $0 \leq c'' \leq 1$ and $0 \leq d'' \leq 1$.

12. A light-emitting semiconductor device according to claim 11, wherein said substrate is in lattice matching with the p-n junction structure.

13. A light-emitting semiconductor device according to claim 11, wherein said substrate is of an n-type and the n-type semiconductor layer and the p-type semiconductor layer are formed on the said substrate in this order.

14. A light-emitting semiconductor device according to claim 11, wherein said substrate is of a p-type and the p-type semiconductor layer and the n-type semiconductor layer are formed on the said substrate in this order.

15. A light-emitting semiconductor device according to claim 11, further comprising an active layer of $(Cu_{a''}Ag_{1-a''})$ $(Al_{b''}Ga_{1-b''})Se_2$ or $(Zn_{c''}Cd_{1-c''})$ $(Se_{d''}Te_{1-d''})$, wherein a'', b'', c'' and d'' have, respectively, the same meanings as defined above, which is sandwiched between the p-type and n-type semiconductor layers, whereby a semiconductor laser device having a heterostructure is obtained.

16. A blue light-emitting semiconductor device which comprises an n-type GaAs substrate, a $Zn(S_{0.06}Se_{0.94})$ semiconductor layer formed on one side of said substrate, a p-type $(Cu_{0.89}Ag_{0.11})AlSe_2$ chalcopyrite layer formed on said semiconductor layer, and a pair of n-type electrode and p-type electrode formed on the other side of said substrate and said chalcopyrite layer, respectively.

17. The device according to claim 16, further comprising an active layer consisting of $(Cu_{0.89}Ag_{0.11})$ $(Al_{0.80}Ga_{0.20})Se_2$ provided between said n-type semiconductor layer and said chalcopyrite layer to form a double heterojunction whereby blue light is emitted from said active layer.

18. A blue light-emitting semiconductor device which comprises a p-type GaAs substrate, a p-type $(Cu_{0.89}Ag_{0.11})AlSe_2$ chalcopyrite layer formed on one side of said substrate, a $(Cu_{0.89}Ag_{0.11})$ $(Al_{0.80}Ga_{0.20})Se_2$ chalcopyrite active layer formed on said p-type chalcopyrite layer, a $Zn(S_{0.06}Se_{0.94})$ semiconductor layer formed on said active layer, and a pair of p-type electrode and n-type electrode formed on the other side of said substrate and said semiconductor layer, respectively.

19. A light-emitting semiconductor device which comprises an n-type InP substrate, an n-type $(Cd(S_{0.83}Se_{0.17})$ semiconductor layer formed on one side of said substrate, an $(Zn_{0.49}Cd_{0.51})Se$ semiconductor active layer formed on said semiconductor layer, a p-type $(Cu_{0.32}Ag_{0.68})$ $(Al_{0.52}Ga_{0.48})Se_2$ chalcopyrite layer formed on said semiconductor active layer, thereby forming a double heterojunction structure, and a pair of n-type electrode and p-type electrode formed on the other side of said InP substrate and said chalcopyrite layer, respectively.

20. A light-emitting semiconductor device which comprises a p-type InP substrate, a p-type $(Cu_{0.32}Ag_{0.68})$ $(Al_{0.52}Ga_{0.48})Se_2$ chalcopyrite layer formed on one side of said substrate, an $(Zn_{0.49}Cd_{0.51})Se$ semiconductor active layer formed on said chalcopyrite layer, an n-type $Zn(S_{0.83}Se_{0.17})$ semiconductor layer formed on said semiconductor active layer, thereby forming a double heterojunction structure, and a pair of p-type electrode and n-type electrode formed on the other side of said InP substrate and said chalcopyrite layer, respectively.

21. A UV light-emitting semiconductor device which comprises an n-type GaP substrate, an n-type $Zn(S_{0.85}Se_{0.15})$ semiconductor layer formed on one side of said substrate, a p-type Photocopies and postage $(Cu_{0.74}Ag_{0.26})$ $(Al_{0.98}Ga_{0.02})Se_2$ chalcopyrite layer formed on said semiconductor layer, and a pair of n-type electrode and p-type electrode formed on the other side of said substrate and said chalcopyrite layer, respectively.

22. The device according to claim 21, further comprising a chalcopyrite active layer consisting of $(Cu_{0.75}Ag_{0.25})$ $(Al_{0.78}Ga_{0.22})Se_2$ provided between said n-type semiconductor layer and said chalcopyrite layer to form a double heterojunction whereby blue light is emitted from said active layer.

23. A UV light-emitting semiconductor device which comprises a p-type GaP substrate, a p-type $(Cu_{0.74}Ag_{0.26})$ $(Al_{0.98}Ga_{0.02})Se_2$ chalcopyrite layer formed on one side of said substrate, a $(Cu_{0.75}Ag_{0.25})$ $(Al_{0.78}Ga_{0.22})Se_2$ chalcopyrite layer formed on said p-type chalcopyrite layer, a $Zn(S_{0.85}Se_{0.15})$ semiconductor layer formed on said active layer, and a pair of p-type electrode and n-type electrode formed on the other side of said substrate and said semiconductor layer, respectively.

24. A blue light-emitting semiconductor device which comprises an n-type GaAs substrate, an n-type $(ZN_{0.40}Cd_{0.60})$ (S semiconductor layer formed on one side of said substrate, an $Zn(S_{0.06}Se_{0.94})$ semiconductor active layer formed on said semiconductor layer, a p-type $(Cu_{0.27}Ag_{0.73})$ $(Al_{0.30}Ga_{0.70})Se_2$ chalcopyrite layer formed on said semiconductor active layer, thereby forming a double-heterojunction structure, and a pair of n-type electrode and p-type electrode formed on the other side of said InP substrate and said chalcopyrite layer, respectively.

25. A blue light-emitting semiconductor device which comprises a p-type GaAs, a p-type $(Cu_{0.27}Ag_{0.73})$ $(Al_{0.30}Ga_{0.70})S_2$ chalcopyrite layer formed on one side of the substrate, a $Zn(S_{0.06}Se_{0.94})$ semiconductor active layer formed on the chalcopyrite layer, a $(Zn_{0.40}Se_{0.60})$ semiconductor layer formed on the active layer thereby forming a heterojunction structure, and a pair of p-type electrode and n-type electrode formed on the substrate and the semiconductor layer, respectively.

26. A light-emitting semiconductor device which comprises an n-type InP substrate, an n-type $Zn(S_{0.52}Te_{0.48})$ semiconductor layer formed on one side of said substrate, a p-type $(Cu_{0.32}Ag_{0.68})$ $(Al_{0.72}Ga_{0.28})Se_2$ chalcopyrite layer formed on said semiconductor layer, and a pair of n-type electrode and p-type electrode formed on the other side of said InP substrate and said chalcopyrite layer, respectively.

27. A light-emitting semiconductor device according to claim 26, further comprising a chalcopyrite active layer consisting of $(Cu_{0.32}Ag_{0.68})$ $(Al_{0.72}Ga_{0.28})Se_2$ provided between said n-type semiconductor layer and said chalcopyrite layer to form a double heterojunction whereby light is emitted from said active layer.

28. A light-emitting semiconductor device which comprises a p-type InP substrate, a p-type $(Cu_{0.32}Ag_{0.68})$ $(Al_{0.72}Ga_{0.28})Se_2$ chalcopyrite layer formed on one side of said substrate, a $(Cu_{0.32}Ag_{0.68})$ $(Al_{0.52}Ga_{0.48})Se_2$ chalcopyrite active layer formed on said chalcopyrite layer, the n-type $Zn(S_{0.52}Te_{0.48})$ semiconductor layer formed on said semiconductor active layer, thereby forming a double heterojunction structure, and a pair of p-type electrode and n-type electrode formed on the other side of said InP substrate and said chalcopyrite layer, respectively.

29. A light-emitting semiconductor device according to claim 28, wherein said $(Cu_{0.32}Ag_{0.68})$ $(Al_{0.52}Ga_{0.48})Se_2$ chalcopyrite active layer is replaced by a $(Zn_{0.71}Cd_{0.29})$ $(Se_{0.82}Te_{0.18})$ layer.

30. A light-emitting semiconductor device which comprises a p-type InP substrate, a p-type $(Cu_{0.32}Ag_{0.68})$ $(Al_{0.72}Ga_{0.28})Se_2$ chalcopyrite layer formed on one side of said substrate, a $(Zn_{0.71}Cd_{0.29})$ $(Se_{0.82}Te_{0.18})Se_2$ chalcopyrite active layer formed on said chalcopyrite layer, an n-type $Zn(Se_{0.52}Te_{0.48})$ semiconductor layer formed on said semiconductor active layer, thereby forming a double heterojunction structure, and a pair of p-type electrode and n-type electrode formed on the other side of said InP substrate and said n-type semiconductor layer, respectively.

* * * * *